United States Patent
Koizumi et al.

(10) Patent No.: US 8,410,668 B2
(45) Date of Patent: Apr. 2, 2013

(54) CRYSTAL ORIENTED CERAMIC COMPOSITE BODY, AND PIEZOELECTRIC/ELECTROSTRICTIVE ELEMENT

(75) Inventors: Takaaki Koizumi, Tajimi (JP); Takuya Katsuno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 93 days.

(21) Appl. No.: 13/118,865

(22) Filed: May 31, 2011

(65) Prior Publication Data

US 2011/0291530 A1 Dec. 1, 2011

(30) Foreign Application Priority Data

Jun. 1, 2010 (JP) ................. 2010-125674

(51) Int. Cl.
*H01L 41/187* (2006.01)
*H01L 41/08* (2006.01)

(52) U.S. Cl. ..................... 310/358; 310/359

(58) Field of Classification Search .............. 310/358, 310/357, 359, 311, 365, 356, 360; 501/1, 501/153; 252/62.9 PZ, 62.9 R
See application file for complete search history.

(56) References Cited

U.S. PATENT DOCUMENTS 6,198,208 B1 * 3/2001 Yano et al. ................. 310/358
8,030,828 B2 * 10/2011 Kobayashi et al. ........... 310/358

FOREIGN PATENT DOCUMENTS

EP 1 972 606 A1 9/2008

* cited by examiner

*Primary Examiner* — Thomas Dougherty
*Assistant Examiner* — Karen B Addison
(74) *Attorney, Agent, or Firm* — Burr & Brown

(57) ABSTRACT

A crystal oriented ceramic composite body is provided, including a substrate that has a first surface and a second surface, and a {100} oriented ceramic film that is disposed to face the first surface. The {100} oriented ceramic film includes a first sectional surface. The first sectional surface is perpendicular to the first surface, and a 90 degree domain includes a domain wall within a range of ±20 degrees of a normal to the first surface and occupies a surface area of at least ⅓ of the first sectional surface.

9 Claims, 5 Drawing Sheets

US 8,410,668 B2

CRYSTAL ORIENTED CERAMIC COMPOSITE BODY, AND PIEZOELECTRIC/ELECTROSTRICTIVE ELEMENT

CROSS-REFERENCE TO RELATED APPLICATIONS

This application claims priority under 35 U.S.C. §119 to Japanese Patent Application No. 2010-0125674 filed on Jun. 1, 2010. The entire disclosure of Japanese Patent Application No. 2010-0125674 is hereby incorporated herein by reference.

BACKGROUND OF THE INVENTION

1. FIELD OF THE INVENTION

The present invention relates to a crystal oriented ceramic composite body and a piezoelectric/electrostrictive element.

2. DESCRIPTION OF RELATED ART

European Patent Publication No. 1972606 discloses the manufacture of a crystal oriented ceramic using a template of particles of lead zirconate titanate (hereinafter referred to as "PZT") in which the crystalline orientation is determined in advance. Furthermore, European Patent Publication No. 1972606 discloses that a crystal oriented ceramic manufactured in this manner exhibits superior piezoelectric/electrostrictive characteristics.

Piezoelectric/electrostrictive materials preferably exhibit a large amount of deformation relative to an applied electrical field intensity. However, the conventional crystal oriented ceramics can not meet expectations in this regard sufficiently.

SUMMARY OF THE INVENTION

The present invention has the object of providing a crystal oriented ceramic for suitable application as a piezoelectric/electrostrictive material that exhibits a large deformation amount.

A crystal oriented ceramic composite body according to a first aspect of the present invention includes a substrate that has a first surface and a second surface, and a {100} oriented ceramic film that is disposed to face the first surface. The {100} oriented ceramic film includes a first sectional surface. The first sectional surface is a sectional surface that is perpendicular to the first surface, and in which a 90 degree domain that includes a domain wall within a range of ±20 degrees of a normal (i.e., normal line) to the first surface occupies a surface area of at least ⅓ of the first sectional surface.

BRIEF DESCRIPTION OF DRAWINGS

Referring now to the attached drawings, which form a part of this original disclosure.

DETAILED DESCRIPTION OF THE INVENTION

1. Crystal Oriented Ceramic Composite Body and Piezoelectric/Electrostrictive Element

1-1 Overview of Configuration of Piezoelectric/electrostrictive Element

An overview of the configuration of the piezoelectric/electrostrictive element of the present embodiment will be described making reference to FIG. 1.

Figure 1:
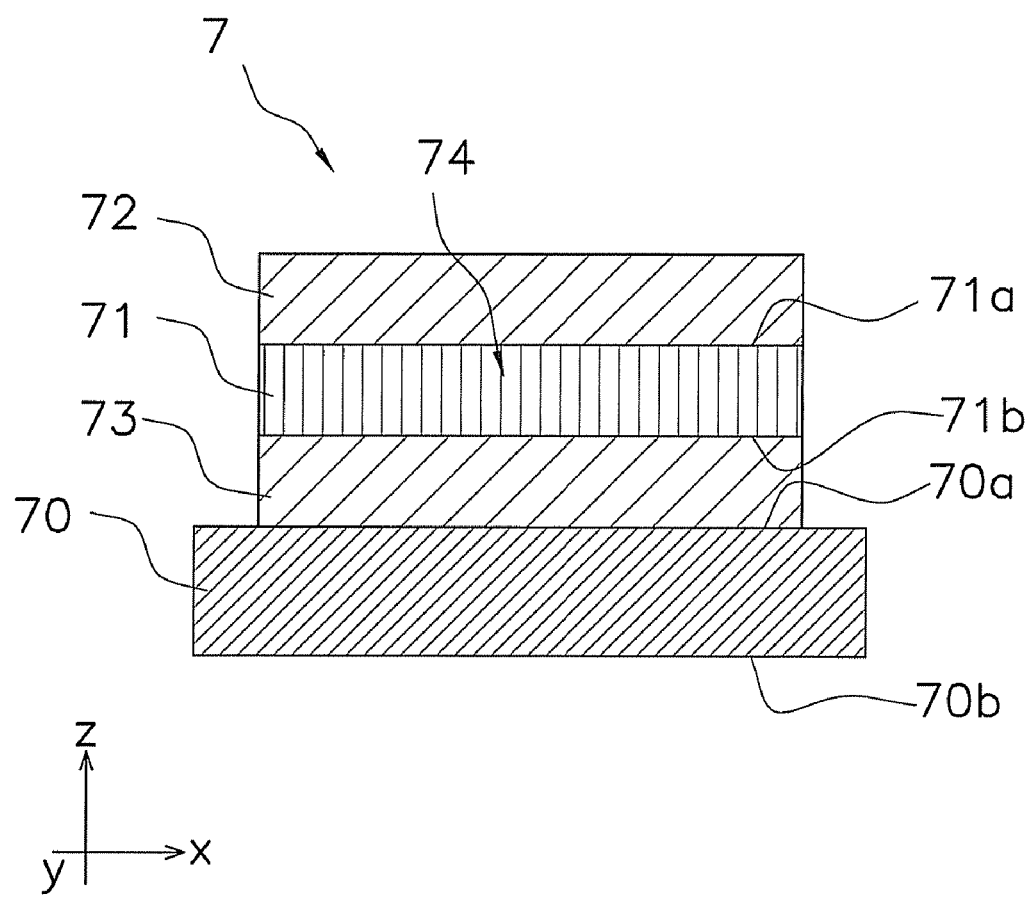
FIG. 1 is a cross sectional view of a piezoelectric/electrostrictive material according to an embodiment of the present invention.

As illustrated in FIG. 1, the piezoelectric/electrostrictive element 7 includes a substrate 70, a ceramic film 71, an upper electrode 72 and a lower electrode 73. A structural body that includes the substrate 70 and the ceramic film 71 is termed a ceramic composite body (i.e., oriented crystal ceramic composite body).

The substrate 70 includes a first surface 70a as the upper surface, and a second surface 70b as the lower surface. The ceramic film 71 includes the first surface 71a as the upper surface, and a second surface 71b as the lower surface.

FIG. 1 illustrates an x axis, y axis and z axis that are mutually orthogonal. The x axis is parallel to the transverse direction, the y axis is perpendicular to the face of the page in FIG. 1, and the z axis is parallel to the longitudinal direction in FIG. 1. In other words, the x-y plane is parallel to the first surface 70a and the second surface 70b of the substrate 70 and to the first surface 71a and the second surface 71b of the ceramic film 71. The sectional surface 74 illustrated in FIG. 1 is parallel to the z-x plane. The z axis is parallel to the direction of thickness of the substrate 70, that is to say, parallel to the normal to the substrate 70.

A distortion is produced in the ceramic film 71 by the electrical field applied between the upper electrode 72 and the lower electrode 73 from a power source (not shown) by electrical connection of the upper electrode 72 and the lower electrode 73 with the ceramic film 71. Furthermore the ceramic film 71 enables conversion of the pressure applied to the ceramic film 71 into a voltage.

The piezoelectric/electrostrictive element 7 may be used either as a piezoelectric element or as an electrostrictive element. That is to say, the ceramic film 71 and the ceramic composite body may be used both as a piezoelectric body and as an electrostrictive body.

The piezoelectric/electrostrictive element 7 in FIG. 1 includes a lower electrode 73 that is disposed between the second surface 71b of the ceramic film 71 and the first surface 70a of the substrate 70. However, the substrate 70 may be combined with the lower electrode 73. When the substrate 70 is combined with the lower electrode 7, the ceramic film 71 may be disposed on the first surface 70a of the substrate 70 without the lower electrode 73. Furthermore, the substrate 70 may have a conductivity, and the lower electrode 73 may be disposed on the second surface 70b of the substrate 70.

1-2 Ceramic Film

The ceramic film 71 is configured so that the second surface 71b of the ceramic film 71 faces the first surface 70a of the substrate 70.

The ceramic film 71 is a {100} oriented film. In other words, the {100} surface of the crystals of the ceramic film 71 is parallel to the planar direction of the substrate 70 (i.e., parallel to the x-y plane). The degree of the {100} orientation of the ceramic film 71 calculated using a Lotgering method is preferably at least 70%, more preferably at least 80%, and still more preferably at least 90%.

Figure 2A:
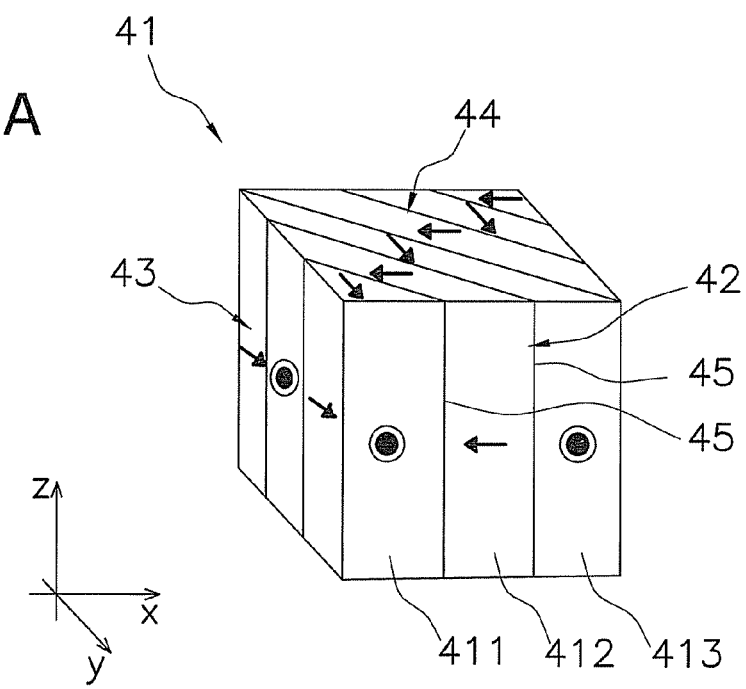
FIG. 2A is a perspective view illustrating an example of a 90 degree domain structure for an oriented crystal ceramic film.

The ceramic film 71 has a 90 degree domain. The ceramic film 71 in particular has a domain structure 41 as illustrated in FIG. 2A. The ceramic film 71 furthermore has a sectional surface that satisfies conditions (i) and (ii) below. This sectional surface is termed a "first sectional surface."

(i) The first sectional surface is perpendicular to the first surface 70a of the substrate 70.

(ii) In the first sectional surface, the 90 degree domain includes a domain wall. The angle of domain wall relative to the normal of the first surface 70a is within a range of ±20 degrees, and the 90 degree domain occupies at least ⅓ (approximately 33.3%) of the first sectional surface.

When condition (i) is satisfied, the first sectional surface is parallel to the direction of thickness of the ceramic film 71. The first sectional surface 74 is an example of the first sectional surface. Furthermore in FIG. 1, since the upper electrode 72 and the lower electrode 73 are disposed to sandwich the ceramic film 71, the first sectional surface 74 is parallel to the direction of application of the electrical field.

It is sufficient when the ceramic film 71 includes at least one cross sectional surface that satisfies conditions (i) and (ii) above. There may be a plurality of cross sectional surfaces which pass through the ceramic film 71 and are perpendicular with respect to the first surface 70a. The plurality of cross sectional surfaces may include a surface that does not satisfy condition (ii) above.

Next, the domain configuration will be described making reference to FIG. 2A-FIG. 2C and FIG. 3A-FIG. 3C. In the following description, the ceramic film 71 has a tetragonal crystal structure.

FIG. 2A illustrates three cross sectional surfaces 42-44 for the domain structure 41. The cross sectional surface 42 is parallel to the z-x plane, the sectional surface 43 is parallel to the y-z plane, and the sectional surface 44 is parallel to the x-y plane. As illustrated in FIG. 2A, the domain structure 41 includes a plurality of domains. Six domains are illustrated in FIG. 2A, and of those six domains, three domains are denoted with the reference numerals 411-413. A domain wall 45 is provided between the domains. The domain wall 45 is a {110} surface. The direction of polarization of each domain is illustrated by the arrow in FIG. 2A-FIG. 2C.

In the 90 degree domain, the angle between the direction of polarization of one domain and the direction of polarization of the adjacent domain is 90 degrees. For example, in the domain structure 41, the angle between the direction of polarization of the domain 411 and the direction of polarization of the domain 412, and the angle between the direction of polarization of the domain 412 and the direction of polarization of the domain 413 are 90 degrees.

In FIG. 2A, the domain wall 45 of the domain structure 41 is substantially parallel to the z axis. "Substantially parallel" as used herein means an allowance of deviation by ±20 degrees from the parallel. In other words, the angle of inclination of the domain wall 45 with respect to the z axis has an allowance of within ±20 degrees.

In other words, as illustrated in FIG. 2A, in the sectional surface 42 that is parallel to the z-x plane in the domain structure 41, the c surface (i.e., {001} surface) and the a surface (i.e., {100} surface) appear alternately. In other words, the c surface of the domain 411, the a surface of the domain 412 and the c surface of the domain 413 are arranged in the x axis direction in that sequence on the sectional surface 42. Furthermore as illustrated in FIG. 2A, the domain wall 45 of the sectional surface 42 is substantially parallel to the z axis. However, as described above, the inclination of the domain wall 45 with respect to the y axis in the sectional surface 42 has an allowance of within a range of ±20 degrees.

Figure 2B:
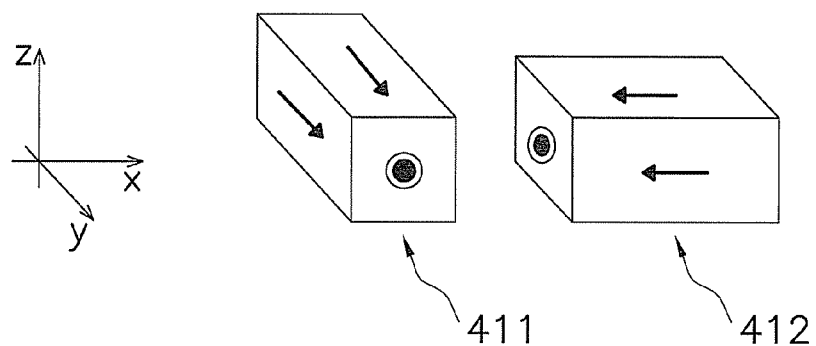
FIG. 2B is an enlarged view of the domain included in the 90 degree domain structure illustrated in FIG. 2A.
Figure 2C:
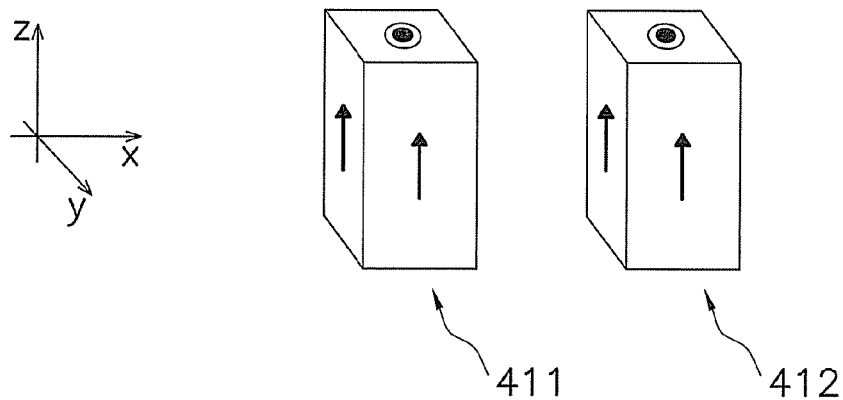
FIG. 2C schematically illustrates the domain rotation when an electrical field is applied to the domain illustrated in FIG. 2B.

The domain structure 41 that has the above structure configures the c axis (i.e., long axis) of each domain to be substantially parallel to the x-y plane. In FIG. 2B, each domain is enlarged.

In the z axis direction, when an electrical field is applied at greater than a certain intensity, each domain rotates through 90 degrees. That is, each domain changes from the state illustrated in FIG. 2B to the state in FIG. 2C. In other words, in tetragonal crystals, the short axis (a axis) and the long axis (c axis) become interchanged. In this manner, deformation is produced in the domain structure 41 as a result of the rotation of the domains in addition to deformation with respect to the direction of polarization in each domain. In the domain structure 41, since this type of rotation may occur in all domains, a large amount of deformation may occur.

Figure 3A:
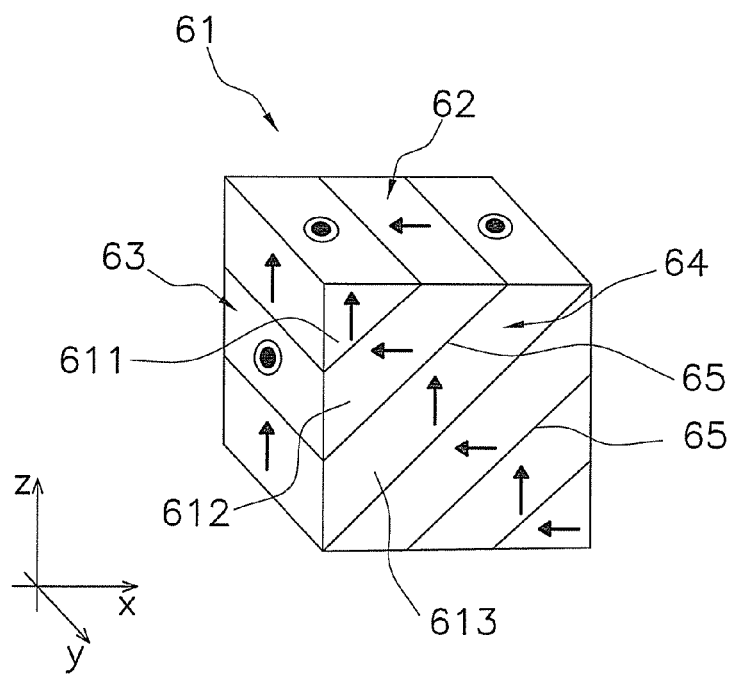
FIG. 3A is a perspective view illustrating another example of a 90 degree domain structure for an oriented crystal ceramic film.

FIG. 3A illustrates a domain structure 61 that includes a different domain wall angle. The domain structure 61 includes a plurality of domains. Six domains are shown in FIG. 3A, and three of those domains are denoted with the reference numerals 611-613. The domain wall is denoted with the reference numeral "65". In the same manner as FIG. 2A-FIG. 2C, the direction of polarization of each domain is shown by the arrow in FIG. 3A-FIG. 3C.

FIG. 3A illustrates three sectional surfaces 62-64 of the domain structure 61. The sectional surface 62 is parallel to the x-y plane. The sectional surface 63 is parallel to the y-z plane, the sectional surface 64 is parallel to the z-x plane. In contrast to the domain structure 41, in both the sectional surfaces 63 and 64 of the domain structure 61 illustrated in FIG. 3A, a domain wall that is substantially parallel to the z axis does not appear. In the domain structure 61, the angle between the domain wall 65 and the z axis is substantially 45 degrees. In other words, the a surface of each domain appears in the sectional surface 64, and the angle between the domain wall 65 that appear in the sectional surface 64 and the z axis is 45 degrees.

Figure 3B:
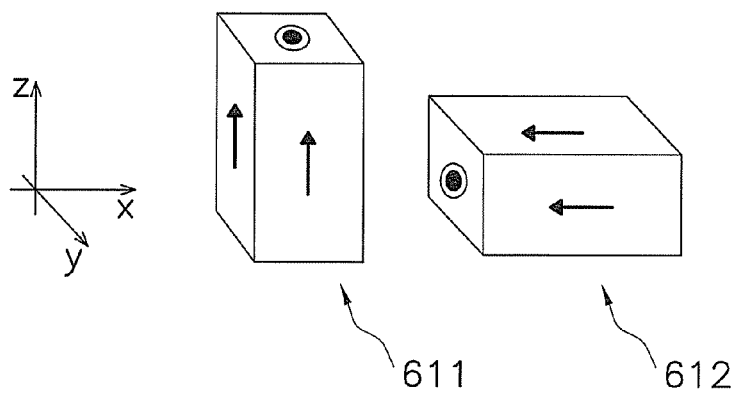
FIG. 3B is an enlarged view of the domain included in the 90 degree domain structure illustrated in FIG. 3A.
Figure 3C:
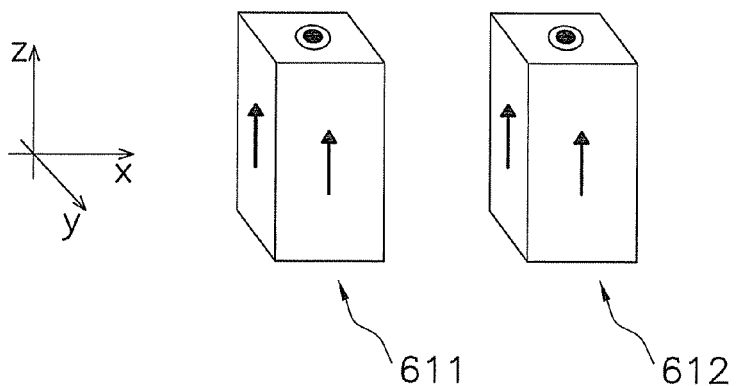
FIG. 3C schematically illustrates the domain rotation when an electrical field is applied to the domain illustrated in FIG. 3B.

FIG. 3B illustrates an enlargement of each domain of the domain structure 61. In the domain structure 61, the c axis (i.e., long axis) of the domain 611 is substantially parallel to the z axis. The c axis of the domain 612 is substantially parallel to the x axis. In other words, as illustrated in FIG. 3A, in the domain structure 61, the c axis of half of the domains is substantially parallel to the z axis.

When an electrical field is applied at greater than a certain intensity in the z axis direction relative to the domain structure 61 illustrated in FIG. 3A, the domain 612 rotates through 90 degrees (see FIG. 3C) in the same manner as the domain 412 in FIG. 2A. However, since the c axis before application of the electrical field is parallel to the z axis, rotation does not occur even after application. Generally, the amount of deformation due to domain rotation is greater than the amount of deformation due to distortion of individual domains. As described above, the domain structure 41 of FIG. 2A includes more domains that have c axis that is substantially parallel to the x-y plane than the domain structure 61 in FIG. 3A. Therefore, the domain structure 41 in FIG. 2A exhibits a larger amount of deformation than the domain structure 61 in FIG. 3A.

As described above, the first sectional surface 74 of the ceramic film 71 fulfills conditions (i) and (ii) above. That is to say, at least ⅓ of the surface area of the first sectional surface 74 has a structure that is the same as the sectional surface 42 in FIG. 2A. As a result, when a voltage is applied between the upper electrode 72 and the lower electrode 73, that is to say, when an electrical field is applied in the y axis direction, the proportion of rotating domains is relatively high. Therefore, a large amount of deformation is realized in the ceramic film 71.

Since the domain wall 45 is substantially parallel to the z axis, in the sectional surface that is parallel to the z axis direction (except for the sectional surface parallel to the domain wall 45), the domain wall 45 is substantially parallel to the z axis. For example, in the sectional surface 43, the domain wall 45 is substantially parallel to the z axis. In other words, the sectional surfaces that are parallel to the z axis direction (except for the sectional surface that is parallel to the domain wall 45) are so-called the a-c domain walls, and those domain walls are substantially parallel to the z axis. Therefore on a sectional surface other than the sectional surface 74 in the ceramic film 71 (for example, a sectional surface parallel to the y-z plane), the 90 degree domain that has a domain wall that is substantially parallel to the z axis can occupy at least ⅓ of the surface area. In this manner, the ceramic film 71 may include a plurality of first surfaces.

In the first sectional surface, the surface area occupied by the 90 degree domain that includes a domain wall that is substantially parallel to the z axis is preferably at least ½, and still more preferably at least ⅔.

More specifically, the ceramic film 71 may include at least one substance as a main component, the substance being selected from the group consisting of Pb (Zr, Ti)$O_3$, Pb (Mg, Nb)(Zr, Ti)$O_3$, Pb (Ni, Nb) (Zr, Ti)$O_3$, Pb (Zn, Nb) (Zr, Ti)$O_3$, Pb(Yb, Nb) (Zr, Ti)$O_3$, (Pb, Sr)(Zr, Ti)$O_3$, (Pb, Ba)(Zr, Ti)$O_3$, (Pb, La)(Zr, Ti)$O_3$, (Bi, Pb)(Ni, Nb)(Zr, Ti)$O_3$, (Bi, Pb)(Mg, Nb)(Zr, Ti)$O_3$, (Bi, Pb)(Zn, Nb)(Zr, Ti)$O_3$, (Pb, Sr, La) (Mg, Ni, Nb) (Zr, Ti) $O_3$, PbTi$O_3$, Pb (Mg, Nb)Ti$O_3$, Pb (Ni, Nb)Ti$O_3$, and Pb (Zn, Nb)Ti$O_3$.

In this specification, "includes substance A as a main component" may mean that a certain composition includes the specified substance A at least 80 wt %, or preferably at least 90 wt %.

The ceramic film 71 may include at least one of boron and aluminum. The ceramic film 71 may include both of boron and aluminum. Furthermore the boron concentration in the ceramic film 71 is preferably at least 0.05 wt % when converted to a concentration of boron oxide ($B_2O_3$). The boron concentration is preferably no more than 6 wt % when converted to a concentration of boron oxide ($B_2O_3$). The aluminum concentration in the ceramic film 71 is preferably at least 0.05 wt % when converted to a concentration of aluminum oxide (alumina: $Al_2O_3$). The aluminum concentration in the ceramic film 71 is preferably no more than 6 wt % when converted to a concentration of aluminum oxide (alumina: $Al_2O_3$). When both boron and aluminum are contained in the ceramic film 71, the total of the concentration of boron and aluminum (as oxides) is preferably at least 0.05 wt %. When both boron and aluminum are contained in the ceramic film 71, the total of the concentration of boron and aluminum (as oxides) is preferably no more than 6 wt %.

1-3. Substrate

A known configuration as a substrate used in a piezoelectric/electrostrictive element may be used in the substrate 70. The substrate 70 may be a crystal oriented material, or a non-oriented material. Furthermore, the substrate 70 may be a monocrystalline material (monocrystalline silicon, gallium arsenide, silicon carbide, strontium titanate, and the like), or may be polycrystalline. A non-oriented material is a material in which the degree of orientation of crystal orientation is no more than 10.

More specifically, the substrate material may include at least one material selected from the group consisting of glass, ceramic, resin and metal. Glass includes for example quartz, and no alkali glass. The ceramic includes for example zirconium oxide, aluminum oxide, magnesium oxide, mullite, aluminum nitride, and silicon nitride. The resin for example includes epoxy resins and polyester resins. The metal for example includes SUS (stainless used steel), aluminum, and platinum.

In particular, when operating the piezoelectric/electrostrictive element at a high speed, the substrate 70 preferably is non-oriented and polycrystalline. A particularly preferred example of this type of substrate 70 is a non-oriented and polycrystalline ceramic. This type of substrate 70 realizes superior strength, and therefore is also adapted for use during high-speed operation.

1-4. Electrodes

A known conductive material may be used as the upper electrode 72 and the lower electrode 73. The material for the upper electrode 72 and the lower electrode 73, more specifically includes:

Platinum, palladium, ruthenium, gold and silver;

Alloys thereof; and

Conductive polymers.

In particular, the material used in the lower electrode 73 may be a non-oriented material and/or a polycrystalline material. In the same manner as the substrate 70, a non-oriented and polycrystalline material is preferred as the lower electrode 73 to realize superior strength.

2. Method of Manufacturing Ceramic Composite Body

An embodiment of a method of manufacturing a ceramic composite body will be described making reference to FIG. 4A-FIG. 4D. The ceramic composite body is a body that includes a substrate and a ceramic film. The method of manufacture described hereafter may be applied to the formation of the ceramic film 71 above. However, the method of forming the ceramic film 71 is not limited to this method of manufacture.

This method includes the steps (1) to (3) below.

(1) Template layer preparation step: preparing of a template layer with crystal orientation in a predetermined direction.

(2) Matrix formation step: forming a matrix by arranging a mixed material in which an additive including lithium and boron mixed with a material including lead on the template layer.

(3) Firing step: firing the matrix and the template layer at a predetermined firing temperature.

Each step will be described below.

(1) Template Layer Preparation Step

This step is a step for preparation of the template layer 19 including the template particles 14. In the template layer 19, the planar orientation of the template particles 14 is arranged in the {100} direction. All of the {100} surfaces of the template particles 14 may be arranged, or a certain proportion of the {100} surfaces of the template particles 14, for example at least 70%, and preferably at least 80% of the {100} surfaces of the template particles 14 may be arranged.

In addition to the template particles, the template layer 19 includes an adhesive compound for fixation onto the substrate 12 by heat or potential difference.

(i) First Example of Template Layer Preparation Step

An example of the template layer preparation step will be described below with reference to FIG. 4A to FIG. 4D. The template layer 19 is prepared by fixing the template particles 14 that are configured by a material that includes lead to the substrate 12. More specifically, this step includes a particle layer formation processing, a fixation process and a washing process.

Figure 4A:
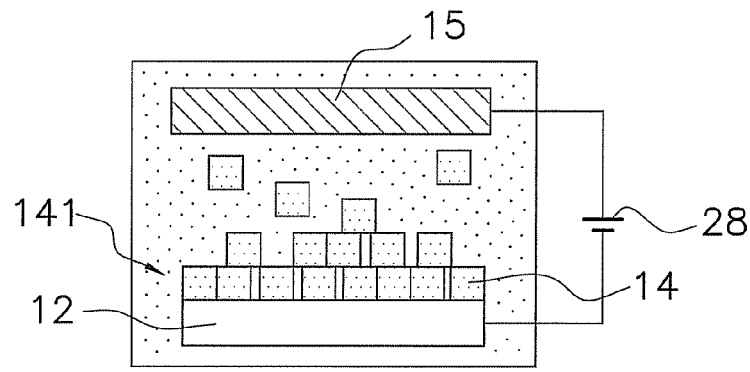
FIG. 4A illustrates the particle layer forming process and the fixation process in a template layer preparation step.

As shown in FIG. 4A, a layer that is configured by template particles 14 is formed on the substrate 12 by the particle layer formation process.

The substrate 12 corresponds to the substrate 70 above.

Ceramic particles are preferably used as the template particles 14, and for example, particles of ceramic that include lead for example are used. The template particles 14 are formed in a cubic structure. The template particles 14 may be manufactured using a hydrothermal synthesis method. The ceramic including lead may include at least one substance selected from the group of substances in [1] or [2] below.

[1] $Pb(Zr, Ti)O_3$, $Pb(Mg,Nb)(Zr, Ti)O_3$, $Pb(Ni, Nb)(Zr, Ti)O_3$, $Pb(Zn, Nb)(Zr, Ti)O_3$, $Pb(Yb, Nb)(Zr, Ti)O_3$, $(Pb, Sr)(Zr, Ti)O_3$, $(Pb, Ba)(Zr, Ti)O_3$, $(Pb, La)(Zr, Ti)O_3$, $(Bi, Pb)(Ni, Nb)(Zr, Ti)O_3$, $(Bi, Pb)(Mg, Nb)(Zr, Ti)O_3$, $(Bi, Pb)(Zn, Nb)(Zr, Ti)O_3$, $(Pb, Sr, La)(Mg, Ni, Nb)(Zr, Ti)O_3$, $PbTiO_3$, $Pb(Mg, Nb)TiO_3$, $Pb(Ni, Nb)TiO_3$, and $Pb(Zn, Nb)TiO_3$.

[2] Starting materials that form the compositions in [1] after firing (for example, the hydroxides or oxides of the substances).

There is no specific numerical limitation on the size of the template particles 14, however the size may be at least 100 nm.

<Particle Layer Formation Process>

The particle layer formation process is a process of forming a particle layer by aligning the template particles 14 on the substrate 12. There is no particular limitation on the specific details of the particle layer formation process as long as the resulting particle layer can be applied to the subsequent fixation process.

The particle layer for example is formed by one method of or combination of two or more methods of (a) to (d) below.

(a) A method of sedimentation of the template particles 14 in a slurry by immersing the substrate 12 in a slurry containing a dispersal of the template particles 14, and allowing to stand.

(b) LB method in which the template particles 14 are oriented with the liquid phase interface, and the substrate 12 immersed in the lower phase is drawn upwardly.

(c) Electrophoresis.

(d) A dip method.

When forming the particle layer, the template particles 14 may be more compactly disposed on the substrate 12 by application of mechanical vibration, sound waves, heat, light or a magnetic field.

The above method (a) is illustrated in FIG. 4A. In FIG. 4A, the slurry 17 includes a solvent or a dispersion medium, a monomer dissolved or dispersed therein, and template particles 14. The monomer can be polymerized by electrolytic polymerization. Specific examples of the monomer will be described below.

In FIG. 4A, the substrate 12 is immersed into the slurry 17 on the surface of which the template particles 14 are floating in a film configuration, and the particle layer 141 may be formed on the substrate by drawing the substrate 12 upwardly thereafter. When the substrate 12 is raised, the monomer may be polymerized by electrolytic polymerization as described below and the particle layer 141 may be fixed to the polymerized resin 18 by application of a potential difference to the substrate 12 and a counter electrode 15. This process enables fixation of the template particles 14 that is substantially simultaneous with the formation of the particle layer 141. As a result, a relatively thin particle layer 141 can be formed.

<Fixation Process>

The fixation process enables formation of a resin that is a polymer body by electrolytic polymerization of the monomer in the slurry.

The monomer included in the slurry 17 for example includes:

A vinyl monomer such as styrene, N-vinylcarbazole, or the like;

Aromatic ring compounds such as aniline, phenol, or the like;

Heterocyclic ring compounds such as a pyrrole, a thiophene, or a furan, or the like.

A pyrrole monomer includes a pyrrole, an alkyl pyrrole, an amino pyrrole or the like. A thiophene includes a thiophene, an alkyl thiophene, a thiophene derivative or the like.

Of the solutions that include the above monomers, an aqueous pyrrole solution is in particular associated with ease of handling and therefore is preferably used.

To induce electrolytic polymerization, the slurry 17 may include an oxidant such as an alkyl benzene sulfonate including sodium p-toluenesulfonate, sodium ethylbenzenesulfonate, sodium dodecylbenzenesulfonate, or the like.

As illustrated in FIG. 4A, a counter electrode 15 is disposed to face the substrate 12 in the reaction vessel.

After forming the particle layer 141 by sedimentation of the template particles 14 onto the substrate 12, a potential difference is formed between the substrate 12 and the counter electrode 15 by a power source 28 in a state in which the substrate 12 is immersed in the slurry 17. The monomers in the slurry 17 are subjected to electrolytic polymerization on the substrate 12 by the potential difference. The polymer body formed by electrolytic polymerization is denoted in FIG. 4C as the resin 18.

Although the mechanism depends on the type of monomer, the mechanism of electrolytic polymerization for example includes:

a polymerization reaction mediated by a radical cation or a radical anion;

a polymerization reaction produced by oxidation or reduction of a common supporting electrolyte or an additive to thereby product a type of reaction activity due to cations, anions, or free radicals;

chain polymerization; and sequential polymerization, or the like.

During electrolytic polymerization, the electrical conditions such as voltage, current and the like, and the processing time may be varied in response to the size of the template particles for fixation, and the size and the thickness of the target particle layer 141.

Figure 4B:
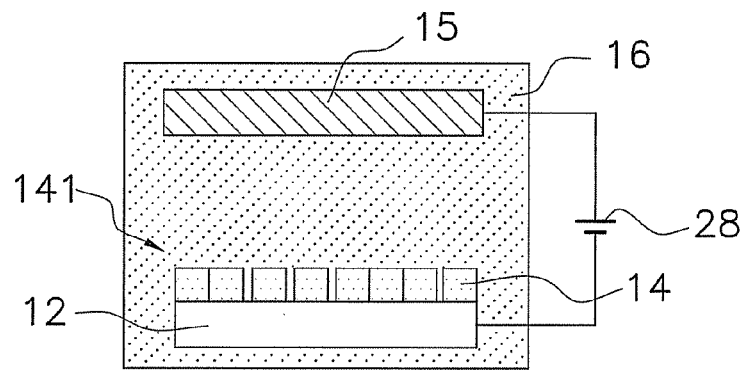
FIG. 4B illustrates the repolymerization process in the template layer preparation step.
Figure 4C:
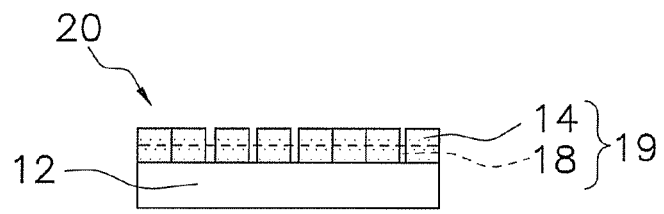
FIG. 4C illustrates a particle fixation body in the template layer preparation step.

In this manner, as illustrated in FIG. 4C, the template layer 19 including the template particles 14 and the resin 18 is formed on the substrate 12. The resin 18 is enters between the template particles 14 to thereby mechanically fix the template particles 14. In this manner, a particle fixation body 20 can be obtained that includes the substrate 12 and the template layer 19.

<Washing Process>

Excess template particles 14 on the substrate 12, that is to say, template particles 14 that are not fixed by the resin 18 produced by electrolytic polymerization are removed by a washing process. The washing process is executed by water washing, ultrasonic wave washing or the like.

<Repolymerization Process>

The template layer preparation process may further include a repolymerization process.

As illustrated in FIG. 4B, during repolymerization, the substrate 12 after passing through the particle layer formation process and the fixation process is immersed in the monomer solution 16. The monomer solution 16 does not contain template particles 14, but does contain monomers for electrolytic polymerization. More specific examples of the monomers include those monomers described above. In the same manner as the fixation process, the monomers are subjected to electrolytic polymerization by application of a potential difference to the substrate 12 and the counter electrode 15.

The washing process described above may be performed after the repolymerization process, or may be performed before and after the repolymerization process.

(ii) Other Examples of Template Layer Preparation Step

The particle layer 141 may be formed without use of the slurry 17. This type of formation method includes one or more methods including a method of coating using a spray process, a spin coating method, or a doctor blade method.

Although these examples are omitted from the figures, the elements already described above are described below by use of the same reference numerals.

The fixation process is executed by the same methods as those in FIG. 4B in relation to the substrate 12 that includes a particle layer 141 formed in this manner. In other words, the particle fixation body 20 is formed by electrolytic polymerization of the monomers in the monomer solution 16 in a state in which the substrate 12 is immersed in the monomer solution 16.

(iii) Further Examples of Template Layer Preparation Process

The fixation compound in the fixation process may be a thermoplastic electrodeposition material in substitution for the resin formed by electrolytic polymerization to thereby enable manufacture of a particle fixation body that includes the substrate 12 and template particles 14 that are fixed to the substrate 12. This method includes an electrodeposition material layer formation process, a fixation process, and a washing process.

<Electrodeposition Material Layer Formation Process>

The electrodeposition material layer formation process is a process of forming an electrodeposition material layer, that is a layer of thermoplastic electrodeposition material, on the substrate 12. In the electrodeposition material layer formation process, the substrate 12 is immersed in the thermoplastic electrodeposition material solution that includes the electrodeposition material in a state in which the counter electrode is opposed to the substrate 12. At this time, an electrodeposition material layer, that is a thermoplastic electrodeposition material layer, is formed by producing a potential difference between the substrate 12 and the counter electrode.

For example, the thermoplastic electrodeposition material includes:

a carbon-based polymer compound such as an epoxy resin, a polyimide resin, a polyamideimide resin, and an acrylic resin, or the like;

a silicon-based polymer compound such as silicon resin, or the like; and a nanoparticle of an oxide such as alumina that has a dispersal agent on a surface thereof, and has an electrostatic charge applied thereto. Furthermore the thermoplastic electrodeposition material may include both a cationic form in which the coated material compound carries a positive charge, or an anionic form in which the coated material compound carries a negative charge. The potential on the substrate 12 side is determined by whether the thermoplastic electrodeposition material is configured in a cationic form or an anionic form.

The solvent or the dispersion medium in the thermoplastic electrodeposition material solution includes for example, an inorganic solvent such as water, or an organic solvent such as alcohol. More specifically, the thermoplastic electrodeposition material solution may be an aqueous electrodeposition coating material. An aqueous electrodeposition coating material is preferably used in view of simple handling.

The thermoplastic electrodeposition material solution may include an enzyme such as a curing agent including blocked isocyanates, or the like, or a tin compound.

The electrodeposition material layer may be dried using a heater or the like.

<Particle Layer Formation Process>

The template particles 14 are disposed on the electrodeposition material layer by the particle layer formation process. Since description of the formation of the particle layer has already been provided, detailed description thereof will be omitted.

<Fixation Process>

Next, the template particles 14 are fixed by the electrodeposition material layer to the substrate 12 by heating of the electrodeposition material layer. In this manner, the template layer is formed. Application of heat may be executed by use of a heater, an oven, and/or an electromagnetic wave radiating apparatus or the like.

Heating of the thermoplastic electrodeposition material causes the thermoplastic electrodeposition material to enter between the template particles 14. Therefore, the template particles 14 in the template layer are mechanically fixed to the substrate 12 by the thermoplastic electrodeposition material that has entered between the template particles 14.

Needless to say, processing such as the washing process or the like may be executed on a subsequent occasion.

1-4 Combinations

The processes, the steps, the materials and the apparatuses, or the like described in relation to the various types of template layer preparation steps described above may be combined.

(2) Matrix Formation Step

Figure 4D:
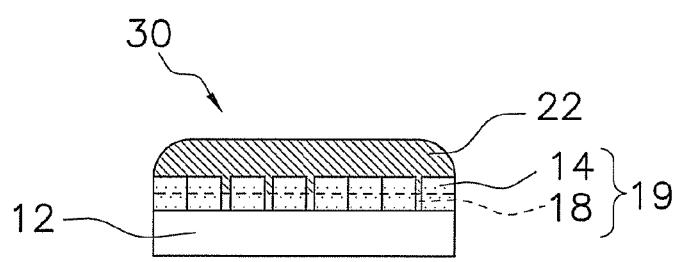
FIG. 4D illustrates a shaped body in the matrix formation step.

The matrix formation step is a step in which the matrix material is disposed on the template layer. In this manner, as illustrated in FIG. 4D, the matrix 22 is formed on the template layer 19 to thereby prepare a shaped body 30.

The matrix material is preferably a known material that is used in the manufacture of crystal oriented ceramics. The main component of the matrix material may be at least one substance of the group of substances in [1] or [2] above that were given as examples of the material for the template particle. The composition of the matrix material is determined in accordance with the target crystal oriented ceramic and the above composition for the template particle 14, or the like.

The matrix material may further include an additive. The additive is preferably aluminum and/or boron. Aluminum may be added as alumina ($Al_2O_3$). Boron may be added as boron oxide ($B_2O_3$).

Other additives include for example lithium. A substance including lithium and boron may be used. An additive that includes lithium and boron includes for example at least one compound selected from the group consisting of $LiBO_2$, $Li_2B_4O_7$, $LiB(OH)_4$, $Li_3BO_3$, $Li_6B_4O_9$, $LiB_3O_5$, and $Li_2B_8O_{13}$. Furthermore, lithium may be contained in at least one additive of $Li_2CO_3$ and LiF.

The concentration of the respective additives in the matrix material is preferably at least 0.05 wt % to no more than 6 wt % of the matrix material overall (the total of the main component and the additives). Furthermore, the total of the concentration of these additives is preferably at least 0.05 wt % to no more than 6 wt % of the matrix material overall. However, the concentration of aluminum is taken to be the concentration of alumina, and the concentration of boron is the concentration of boron oxide.

The method of disposing the matrix material for example includes at least method or a combination of two or more methods selected from a method of coating using a spray process;

a spin coating method;

a doctor blade method; or a dip method.

(3) Firing Step

The firing step is a step in which the resulting shaped body is fired at a predetermined firing temperature to thereby remove the resin 18 and form the template layer 19 and the matrix 22 as a ceramic film 71. In other words, in this step, a crystal oriented ceramic is produced.

The firing temperature is set in response to the composition of the target ceramic.

The firing temperature is set for example at no more than 1100° C., and preferably no more than 1000° C. The firing temperature is preferably at least 900° C. The temperature required for orientation of the crystals can be reduced to a lower temperature by an additive that includes lithium and boron.

The atmosphere for firing is not particularly limited to a specific gas, and may be air.

Crystals in the matrix 22 grow along the crystalline orientation in a predetermined direction on the template layer 19 due to the additive. In this manner, a ceramic with high orientation along the crystal orientation can be manufactured by firing of the substrate 12 forming the template layer 19 and the matrix 22 on the surface.

Since lithium becomes volatile as a result of firing, the fired body may exhibit a lower concentration of lithium content than the shaped body prior to firing.

In the present embodiment, the ceramic film is formed using a reactive template grain growth method (RGTT) by a process as described above. As a result of crystal growth using a template such as a RGTT method or the like, the choice of materials for use as the substrate can be increased without the need for use of an oriented material as the substrate. However, there is no particular limitation on the forming method for the ceramic film.

(4) Post-Annealing Step

The method of manufacturing the ceramic may include a post-annealing step. The post-annealing step is a step in which the fired body (i.e., ceramic) that is obtained after the firing step is heated. In this step, the amount of the additive contained in the ceramic is reduced.

The post-annealing step for example may be executed under the same conditions of temperature, retaining time and atmosphere as the conditions for the firing step. The post-annealing step may include any of, or a combination of:

retaining the fired body for a long period of time at a lower temperature than the conditions for the firing step, for example, the temperature of at least 700° C. and no more than 1000° C.; or adjusting the partial pressure of oxygen in the atmosphere to facilitate volatility of the additive, and heating the fired body in the atmosphere.

(5) Electrode Formation

The piezoelectric/electrostrictive element 7 may be manufactured by executing the steps (1) to (4) above using the substrate 12 that forms the lower electrode 73, and thereafter forming an upper electrode 72.

When the substrate 12 (i.e., substrate 70) is combined with the lower electrode 73, the formation step for the lower electrode is not required.

The electrode patterning method includes use of any of vapor deposition, sputtering, screen printing, electroless plating, or interfacial polymerization of the monomer.

(6) Other Aspects

At least one of the template layer and the matrix may be formed as a sheet in advance. For example, a template sheet may be prepared by aligning the template particles 14 in which the crystal orientation is arranged in a predetermined direction to form a sheet shape, and preparing a matrix sheet by forming a mixed material in which an additive that contains lead is mixed with an additive that contains lithium and boron to thereby prepare a laminated body by alternate lamination of these layers. Then, the laminated body is fired to thereby manufacture a crystal oriented ceramic.

Alternately, after firing the template layer and the matrix together, a ceramic laminated body may be manufactured by adhering these layers together.

EXAMPLES

The examples of the present invention will be described in more detail below. However, the examples do not place a limitation upon the present invention.

Examples

A. Preparation of Test Material

A-1 Template Layer Preparation Step i) Preparation of Template Particles

The substrate was prepared using a platinum substrate having a size of 10 mm×10 mm and a thickness of 0.5 mm.

The material used for the template layer was an aqueous lead solution including a lead acetate trihydrate (Kanto Kagaku Co., Ltd.), ethylenediaminetetraacetic acid (Kanto Kagaku Co., Ltd.), and potassium hydroxide (Kanto Kagaku Co., Ltd.); an aqueous zirconium solution including zirconyl chloride octahydrate (Kanto Kagaku Co., Ltd.), an aqueous solution of titanium chloride (Wako Pure Chemicals Industries Ltd.) and an aqueous solution of potassium hydroxide including potassium hydroxide (Kanto Kagaku Co., Ltd.). These material were mixed so that the molar ratio is Pb:Zr:Ti=1.1:0.7:0.3.

30 ml of the starting material solution was placed in a 100 ml SUS pressure container having an inner wall formed from polytetrafluoroethylene, and a hydrothermal synthesis process was performed for four hours at 165° C. to thereby obtain cubic particles of lead zirconate titanate (hereinafter referred to as "PZT") having a particle diameter of 2 μm. The particle diameter of the PZT particles has a median radius (i.e., D50) measured using water as a dispersion medium with a dynamic scattering particle size distribution measuring apparatus Zetasizer nano-ZS manufactured by Spectris Co., Ltd.

The PZT particles were used as described below as template particles.

ii) Formation of Template Layer

Sodium dodecylbenzenesulfonate (Kanto Kagaku Co., Ltd.) and pyrrole (Kanto Kagaku Co., Ltd.) were added to 30 ml of pure water at 0.01 mol/L (liter) to thereby prepare an aqueous pyrrole solution. The aqueous pyrrole solution was placed in a beaker, and 1 wt % of PZT particles was placed into the pyrrole solution and dispersed using a homogenizer, to thereby prepare a suspension (slurry).

Next, the substrate described above was disposed on the bottom of the beaker containing the slurry, and allowed to stand for 10 minutes until sedimentation of the PZT particles.

Next, SUS counter electrodes were arranged with an interelectrode distance of 1 mm to be parallel to the substrate, and were connected to a power source so that the platinum substrate is the anode and the counter electrode is the cathode. A polypyrrole was synthesized onto the substrate by application of a 2 Hz triangular wave having a peak voltage of 5 V on thirty occasions between the platinum substrate and the counter electrodes.

Excess PZT particles were generally removed by subjecting the substrate on which the polypyrrole was deposited to a rocking motion in the aqueous solution. Thereafter, ultrasonic cleaning was performed in pure water to thereby remove PZT particles that were attached to portions other than the substrate. The ultrasonic cleaning was performed under conditions of 40 kHz for one minute using an ultrasonic cleaning apparatus (Sharp, UT-106).

The above operations obtained a substrate on which PZT particles were fixed in a film configuration to the platinum substrate and had a surface orientation in the {100} direction.

A-2. Matrix Layer Formation Step and Firing Step

Lead oxide (Mitsui Mining and Smelting Co., Ltd), titanium oxide (Ishihara Sangyou Kaisha Ltd.), zirconium oxide (Nippon Denko), bismuth oxide (Taiyo Koko Co., Ltd.), niobium oxide (Mitsui Mining and Smelting Co., Ltd), and nickel oxide (Seido Chemical Co., Ltd.) were used as starting materials for preparing the matrix layer. These starting materials in known a solid phase reaction method were used to prepare a composition (hereinafter this composition is termed 20 BNN-80 PZT) having a composition ratio of 2:8 of nickel bismuth niobate (Bi (Ni, Nb)$O_3$) and lead zirconate titanate (Pb (Zr, Ti)$O_3$).

$Li_2B_4O_7$ (Kojundo Chemicals), $Al_2O_3$ (Sumitomo Chemicals) and LiF (Kojundo Chemicals) were used as additives. Relative to 20 BNN-80 PZT, a concentration of 1 wt % of $Li_2B_4O_7$ was added, a concentration of 0.2 wt % of $Al_2O_3$ was added, and a concentration of 1 wt % of LiF was added. In the polyethylene container, the additives were mixed for 24 hours with 20 BNN-80 PZT in acetone as a solvent.

A powder was obtained by drying the mixed solution. A PZT paste was obtained by adding a butyral binder (BL-S, Sekisui Chemical Co., Ltd.), a dispersal agent (SPO-30, Kao), and plasticizer (DOP, Kurogane Kasei Co., Ltd.), and a solvent (terpineol, Katayama Chemical Ltd.) to the powder, and by mixing and kneading them with a tri-roll mill The PZT paste was uniformly coated using a spin coat method onto the platinum substrate described above on which the PZT particles are oriented. The rotation speed of the spin coat method was 1000 rpm for a time period of 30 sec. After coating of the substrate, drying was performed on a hot plate at 90° C. for 5 minutes to thereby obtain a shaped body. The shaped body was degreased at 500° C. for 2 hours.

The temperature was increased at 200° C./h and maintained at 1000° C. for three hours in order to fire the shaped body after degreasing. The atmosphere during firing was atmospheric air, and after completion of firing, the temperature was decreased by 200° C./h. Thus, a crystal oriented ceramic composite body was obtained A test material for Example 1 was obtained by forming an Au film having a 100 nm thickness as an upper electrode with a sputtering method onto the crystal oriented ceramic composite body obtained with the above operations.

B. Degree of Orientation

The X-ray diffraction (XRD) pattern of the resulting ceramic when X rays were irradiated onto the crystal surface of the ceramic was measured using an XRD apparatus (X-ray Diffraction Apparatus X'Pert MPD Pro manufactured by Spectris Co., Ltd.).

The measurement results were used to calculate the degree of orientation of the pseudo-cubic {100} surface using a Lotgering method by use of the pseudo-cubic {100}, {110} and {111} peaks, and Formula 1 below. The degree of orientation from the Lotgering method is obtained by measuring the XRD pattern relative to the oriented surface of the crystal oriented ceramic, and by calculating with Formula 1 below. In Formula 1, $\Sigma I(hkl)$ is the sum of X-ray diffraction intensities for all crystal surfaces (hkl) measured for the crystal oriented ceramic, $\Sigma I_o$ (hkl) is the sum of X-ray diffraction intensities for all crystal surfaces (hkl) measured for an non-oriented ceramic that has the same composition as the crystal oriented ceramic, $\Sigma' I_o$ (HKL) is the sum of X-ray diffraction intensities for specific crystalline equivalent crystal surfaces (for example (100) surfaces) measured in the crystal oriented ceramic, and $\Sigma' I_0$ (HKL) is the sum of X-ray diffraction intensities for specific crystal surfaces measured for an non-oriented ceramic that has the same composition as the crystal oriented ceramic.

Formula 1

$$\text{Degree of Orientation} = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100\% \quad (1)$$

C. Poling

Electrolysis having an intensity of 3 kV/mm was applied for 1 minute from a DC power source to the resulting test materials to execute a poling process. Thereafter, an ageing process was performed for 12 hours in air at room temperature and having humidity of 40%.

D. Measurement of Amount of Deformation

The amount of deformation of the upper electrode central portion when an electric field having an intensity of 10 kV/mm is applied was measured using a laser Doppler displacement meter.

E. Observation of Sectional Surface

The sectional surface of the test material after measurement was processed into a flat configuration using an ion milling apparatus. After applying a 5 nm coating with a carbon vapor deposition apparatus to the sectional surface, observation of the surface was executed using a thermal field-emission scanning electron microscope (JEOL JSM-7000F). Using an acceleration voltage of 15 kV and an illumination current of 5 nA, a 90 degree domain image was obtained by using channeling contrast of the piezoelectric/electrostrictive film viewed from a backscattered electron image under high contrast conditions. Image data obtained in this manner was used to calculate the grain boundary, and geometrical measurement of the inclination angle of the domain wall was performed using measurement software. Furthermore, the proportion of the image occupied by the region including the domain wall ±20 degrees of the inclination angle was calculated.

Comparative Example 1

A test material was obtained using the same operations as Example 1 with the exception that $Li_2B_4O_7$ and $Al_2O_3$ were not added to the matrix material.

<Results>

The degree of orientation in the ceramic film using the test material in Example 1 was 98%. In contrast, the degree of orientation in the ceramic film in the Comparative Example 1 was 71%.

In the test material in Example 1, the proportion of the region within ±20 degrees of the angle of inclination of the domain wall was 74%. In contrast, the proportion in Comparative Example 1 was 31%.

The amount of deformation observed in Example 1 was 325 nm. However the amount of deformation observed in Comparative Example 1 was 227 nm.

In other words, the ceramic film according to Example 1 exhibits a higher degree of orientation and higher deformation than Comparative Example 1.

Figure 5:
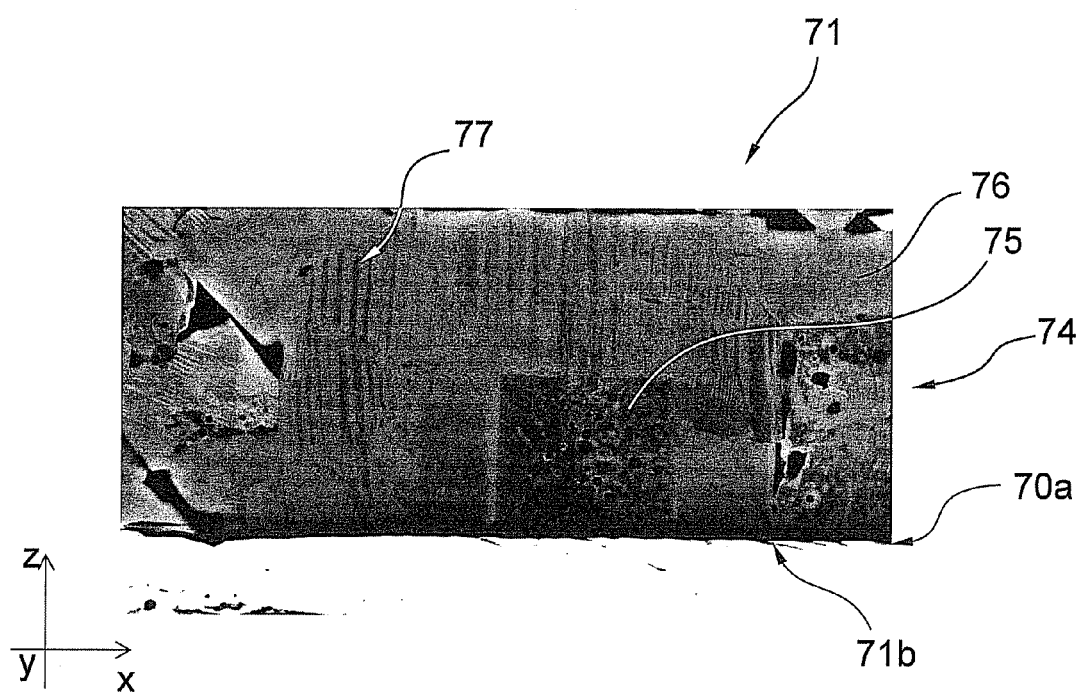
FIG. 5 is a thermal field-emission scanning electron micrograph illustrating the cross sectional surface of the ceramic film according to the example.

FIG. 5 is an image of a sectional surface of the ceramic film obtained in Example 1. As illustrated in FIG. 5, the ceramic film 5 includes a template layer 75 originating in the template particles and a matrix 76 originating in the matrix material. The black bands in the matrix 76 are domain walls 77 that are substantially parallel to the z axis.

One reason for the large deformation amount obtained in the ceramic film according to Example 1 is thought to be the rotation of the domains resulting from the application of an electrical field due to the presence of a plurality of domain walls 77 that are substantially parallel to the z axis.

INDUSTRIAL APPLICABILITY

The ceramic composite body according to the present invention enables uses as a piezoelectric/electrostrictive body. Furthermore the piezoelectric/electrostrictive element can be used in an actuator, ink jet head, speaker, and pressure sensor, or the like.

What is claimed is:

1. A crystal oriented ceramic composite body comprising:
a substrate that has a first surface and a second surface; and
a {100} oriented ceramic film that is disposed to face the first surface;
wherein the {100} oriented ceramic film includes a first sectional surface, the first sectional surface being a sectional surface that is perpendicular to the first surface; and
wherein a 90 degree domain in the first sectional surface includes a domain wall within a range of ±20 degrees of a normal to the first surface and occupies a at least ⅓ of the first sectional surface.

2. The crystal oriented ceramic composite body according to claim 1, wherein the 90 degree domain occupies at least ⅔ of the first sectional surface.

3. The crystal oriented ceramic composite body according to claim 1, wherein the degree of {100} orientation of the {100} oriented ceramic film is at least 70% with reference to a Lotgering method.

4. The crystal oriented ceramic composite body according to claim 1, wherein the oriented ceramic film includes a tetragonal crystal structure.

5. The crystal oriented ceramic composite body according to claim 1, wherein the substrate is configured from a non-oriented material.

6. The crystal oriented ceramic composite body according to claim 1, wherein the oriented ceramic film includes at least one of boron and aluminum.

7. The crystal oriented ceramic composite body according to claim 6, wherein the concentration of boron and/or aluminum in the oriented ceramic film is 0.05-6 wt % when converted to a concentration respectively of an oxide of boron and an oxide of aluminum.

8. A piezoelectric/electrostrictive element comprising:
the crystal oriented ceramic composite body according to claim 1;
an upper electrode sandwiching the {100} oriented ceramic film and facing the substrate; and
a lower electrode sandwiching the {100} oriented ceramic film and facing the upper electrode.

9. The piezoelectric/electrostrictive element according to claim 8 wherein the lower electrode is configured from a non-oriented material.

* * * * *